US010627097B2

(12) United States Patent
Ding et al.

(10) Patent No.: US 10,627,097 B2
(45) Date of Patent: Apr. 21, 2020

(54) OPTICAL PROJECTION DEVICE

(71) Applicant: TRIPLE WIN TECHNOLOGY(SHENZHEN) CO. LTD., Shenzhen (CN)

(72) Inventors: Sheng-Jie Ding, Guangdong (CN); Shin-Wen Chen, New Taipei (TW); Jing-Wei Li, Guangdong (CN); Jian-Chao Song, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/201,946

(22) Filed: Nov. 27, 2018

(65) Prior Publication Data
US 2020/0041114 A1 Feb. 6, 2020

(30) Foreign Application Priority Data

Aug. 1, 2018 (CN) .......................... 2018 1 0860135

(51) Int. Cl.
| | |
|---|---|
| G03B 21/16 | (2006.01) |
| F21V 29/507 | (2015.01) |
| F21V 29/71 | (2015.01) |
| H05K 1/18 | (2006.01) |
| F21V 13/02 | (2006.01) |
| F21V 5/04 | (2006.01) |
| F21V 15/01 | (2006.01) |
| H05K 1/02 | (2006.01) |

(52) U.S. Cl.
CPC .............. *F21V 29/507* (2015.01); *F21V 5/04* (2013.01); *F21V 13/02* (2013.01); *F21V 15/01* (2013.01); *F21V 29/717* (2015.01); *G03B 21/16* (2013.01); *H05K 1/0203* (2013.01); *H05K 1/181* (2013.01); *H05K 2201/066* (2013.01); *H05K 2201/10121* (2013.01); *H05K 2201/10522* (2013.01)

(58) Field of Classification Search
CPC ..... G03B 21/16; G03B 21/145; F21V 29/507; F21V 29/717; F21V 13/02; H04N 9/3144
See application file for complete search history.

(56) References Cited

U.S. PATENT DOCUMENTS

2019/0331988 A1* 10/2019 Chen .................... G03B 21/145

FOREIGN PATENT DOCUMENTS

TW M531101 U 10/2016

* cited by examiner

*Primary Examiner* — Ryan D Howard
(74) *Attorney, Agent, or Firm* — ScienBiziP, P.C.

(57) ABSTRACT

An optical projection device with metallic components for heat dissipation and for structural reinforcement includes a holder and two opposing metal components opposite to each other. The holder comprises lens receiving groove, electric component receiving groove, and connecting receiving groove leading to the exterior. The two opposing metal components comprise first and second heat dissipation parts, and a connecting part. The first heat dissipation part is formed on an exterior surface of the holder, the connecting part is received in the connecting receiving groove, and the second heat dissipation part is formed on an inner wall of the electric component receiving groove.

12 Claims, 4 Drawing Sheets

OPTICAL PROJECTION DEVICE

FIELD

The subject matter disclosed herein generally relates to an optical projection device.

BACKGROUND

Most optical projection devices have a diffraction optical element (DOE), a holder, a collimating lens, a laser, a printed circuit board, and so on. The DOE, the holder, the collimating lens, and the printed circuit board are made of plastic materials. A space defined by the DOE, the holder, the collimating lens, and the printed circuit board is enclosed to avoid dust or debris entering into the interior of the optical projection device. Heat generated by the laser may not be dissipated out the enclosed space quickly and may affect the quality of the light projected out of the optical projection device.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
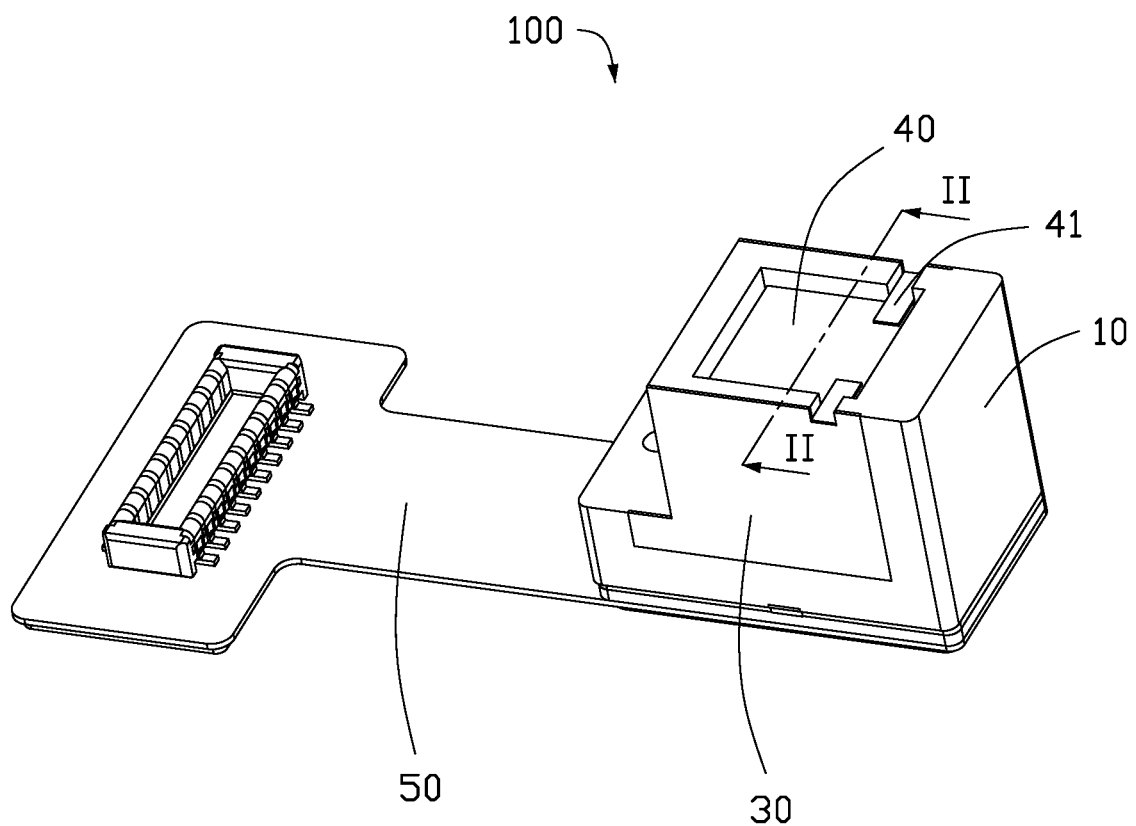
FIG. 1 is a view of an embodiment of an optical projection device according to the present disclosure.
Figure 2:
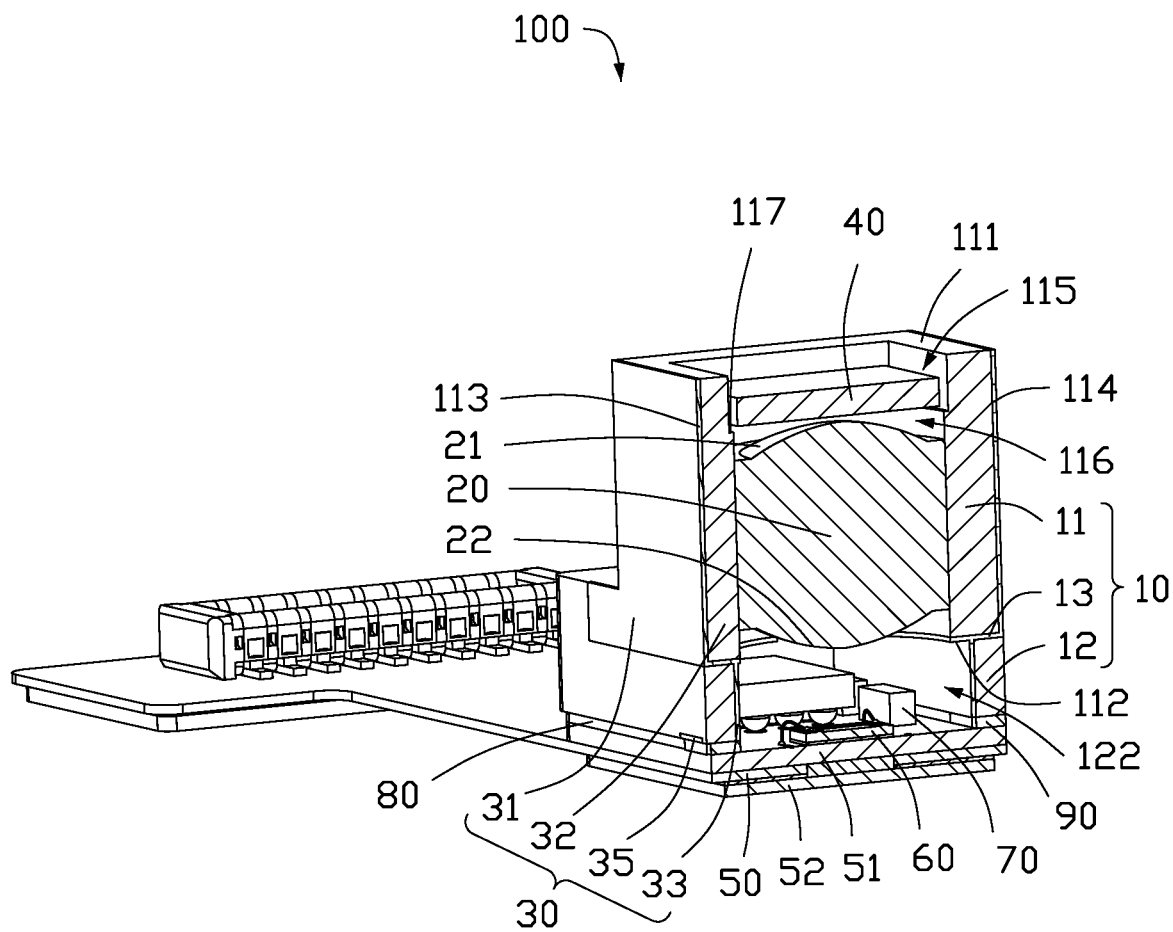
FIG. 2 is a cross-sectional view of the optical projection device of FIG. 1 along line II-II.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIGS. 1-4 show an optical projection device 100. The optical projection device 100 includes a holder 10, a lens 20, two metal components 30, a DOE 40, a printed circuit board 50, a laser 60, and a plurality of electric components 70. The lens 20 and the DOE 40 are received in the holder 10. The two metal components 30 are opposite to each other and each are formed on the holder 10 or embedded in the holder 10. The laser 60 and the plurality of electric components 70 are formed on the printed circuit board 50 and received in the holder 10. The laser 60 faces the lens 20.

The holder 10 includes a lens cone 11 and a base 12. The lens cone 11 is formed on the base 12.

The lens cone 11 includes a first surface 111, a second surface 112 opposite to the first surface 111, a first outside surface 113 vertically connecting each of the first surface 111 and the second surface 112, and a second outside surface 114 opposite to the first outside surface 113.

A DOE receiving groove 115 extends from the first surface 111 to an interior of the lens cone 11. A lens receiving groove 116 extends from the second surface 112 to the interior of the lens cone 11. The lens receiving groove 116 is connected to the DOE receiving groove 115. A diameter of the DOE receiving groove 115 is larger than a diameter of the lens receiving groove 116. A step part 117 is formed between the DOE receiving groove 115 and the lens receiving groove 116.

Figure 3:
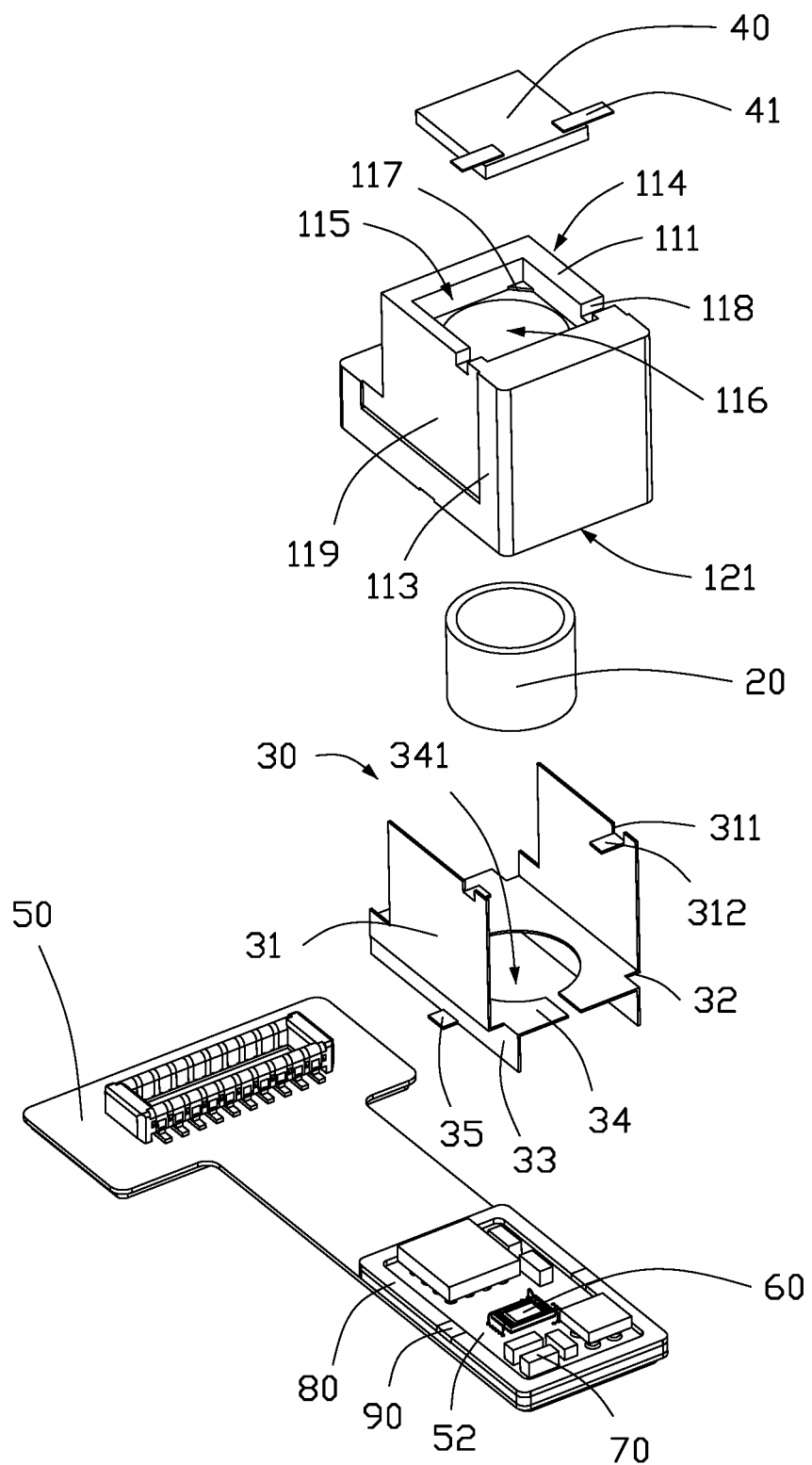
FIG. 3 is an exploded view of the optical projection device of FIG. 1.
Figure 4:
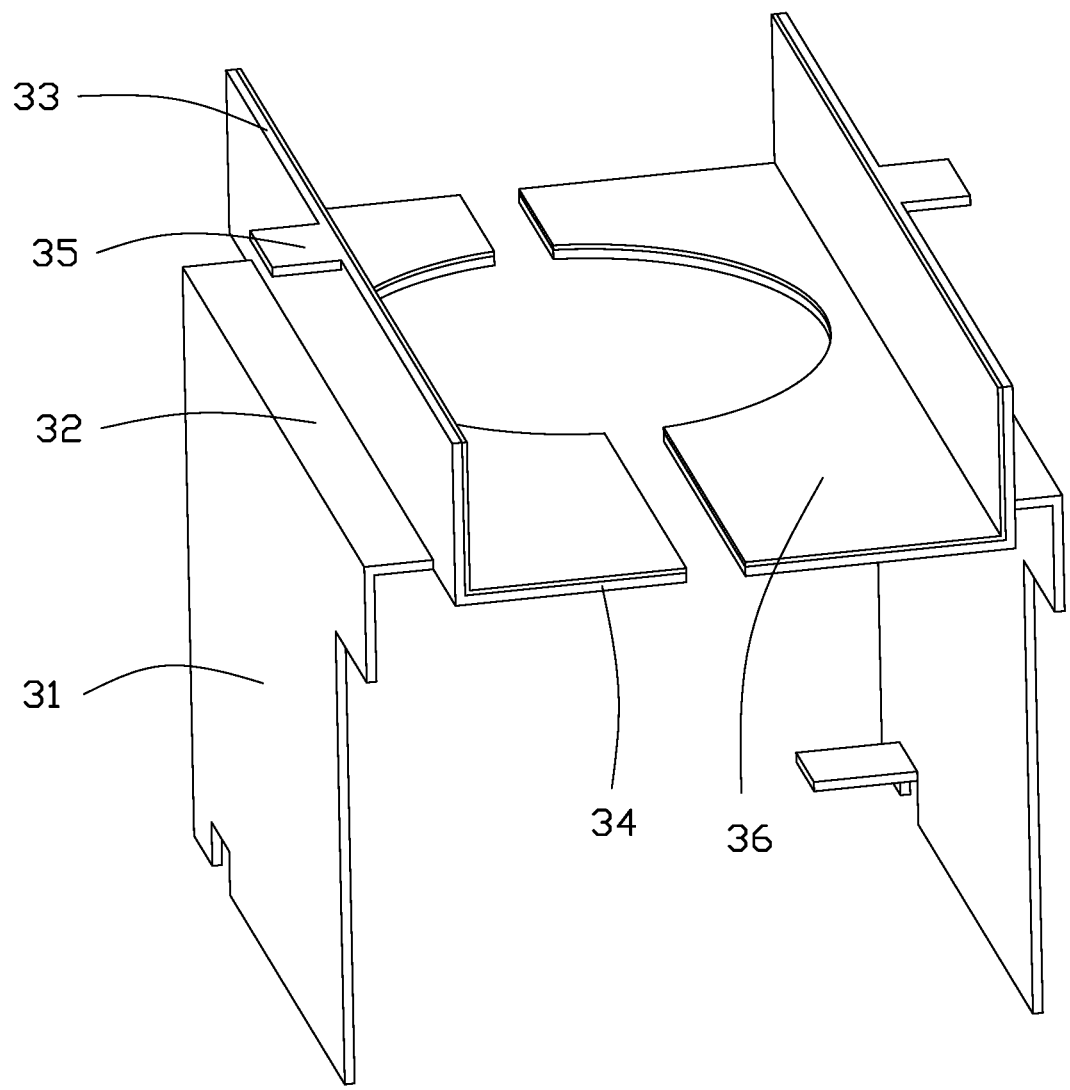
FIG. 4 is a view of a metal component of the optical projection device of FIG. 1 from another angle.

Referring to FIG. 3, each of two first connecting block receiving grooves 118 is formed to extend from the first surface 111 to the interior of the lens cone 11. The two first connecting block receiving grooves 118 are opposite to each other. Each of the two first connecting block receiving grooves 118 is connected to the DOE receiving groove 115.

A first heat dissipation part groove 119 is formed from the first outside surface 113 and the second outside surface 114 to the DOE receiving groove 115. The first heat dissipation part groove 119 runs through the first outside surface 113 or the second outside surface 114. The first heat dissipation part groove 119 is connected to the DOE receiving groove 115 by the first connecting blocks receiving groove 118.

The base 12 includes a third surface 121 opposite to the second surface 112. An electric component receiving groove 122 is formed from the third surface 121 to the second surface 112. The electric component receiving groove 122 is connected to the lens receiving groove 116.

In at least one embodiment, the lens cone 11 and the base 12 are integrally formed. In another embodiment, the lens cone 11 can be connected to the base 12 by screws or adhesive.

The holder 10 further includes a connecting receiving groove 13. The connecting receiving groove 13 is connected to the lens receiving groove 116, the first heat dissipation part grooves 119, and the electric component receiving groove 122.

The lens 20 is received in the lens receiving groove 116. The lens 20 includes a first ophthalmic lens 21 and a second ophthalmic lens 22. The first ophthalmic lens 21 abuts the first surface 111. The second ophthalmic lens 22 abuts the second surface 112.

Each of the two metal components 30 includes a first heat dissipation part 31, a connecting part 32, a second heat dissipation part 33, and an extending part 34. The connecting part 32 is perpendicularly connected to the first heat dissipation part 31 and the second heat dissipation part 33. The extending part 34 extends out from junction of the second heat dissipation part 33 and the connecting part 32 to a direction perpendicular to the second heat dissipation part 33.

Each of the first heat dissipation parts 31 includes a gap 311. The gap 311 is away from the connecting part 32 and opposite to the first connecting block receiving groove 118.

Two first connecting blocks 312 are perpendicular to the first heat dissipation parts 31. One end of each of the first connecting blocks 312 is defined at each of the gaps 311. The first connecting block 312 and the second heat dissipation part 33 lie on a same side of the connecting part 32. A part of the first heat dissipation part 31 is separated and bent to form the first connecting blocks 312 and the gaps 311. The first connecting block 312 is received in the first connecting blocks receiving groove 118.

Two second connecting blocks 35 extend out from the second heat dissipation part 33 and away from the first heat dissipation part 31. The two second connecting blocks 35 are perpendicular to the second heat dissipation part 33. The second connecting block 35 and the extending part 34 lie on different side of the second heat dissipation part 33.

A light-passage 341 is formed on and runs through the extending part 34. The light-passage 341 is arc-shaped. In at least one embodiment, the light-passage 341 is semi-arc-shaped.

The first heat dissipation parts 31 are fixed in the first heat dissipation part grooves 119. The first connecting blocks 312 are received in the first connecting block receiving grooves 118. The connecting part 32 is received in the connecting receiving groove 13. The second heat dissipation parts 33 are fixed in the inner wall of the electric component receiving groove 122. The extending parts 34 are received in the electric component receiving groove 122 and face the laser 60.

The two metal components 30 are opposite to each other. The light-passages 341 face the second ophthalmic lens 22. The second connecting blocks 35 are fixed on the third surface 121 and exposed outside the base 12.

A light-absorbing layer 36 is formed on the second heat dissipation part 33 and the extending part 34. The light-absorbing layer 36 faces the laser 60. The light-absorbing layer 36 prevents reflection of light emitted by the laser 60, further avoiding stray light affecting the quality of the projected light.

The metal components 30 are embedded in the holder 10 by insert molding technology.

The DOE 40 is received in the DOE receiving groove 115 and fixed on the step part 117. The DOE 40 shapes laser beams, for homogenization, collimation, focusing, forming specific patterns, and so on.

The DOE 40 is electrically connected to the first connecting blocks 312 by two first conducting resins 41.

The holder 10 is fixed on the printed circuit board 50 by an adhesive layer 80. The two second connecting blocks 35 are electrically connected to the printed circuit board 50 by a second conducting resin 90.

The layer 60 is received in the electric component receiving groove 122 and faces the second ophthalmic lens 22. The layer 60 is electrically connected to the printed circuit board 50. The layer 60 emits light. The light passes through the light-passages 341 and enters into the second ophthalmic lens 22 and the first ophthalmic lens 21, and then passes through the DOE 40 as projected light.

The plurality of electric components 70 is received in the electric component receiving groove 122 and electrically connected to the printed circuit board 50.

In an embodiment, the optical projection device 100 also includes a ceramic substrate 51 and a stiffening plate 52. The ceramic substrate 51 and the stiffening plate 52 are both formed on the printed circuit board 50 and opposite to each other. The laser 60 and the plurality of electric components 70 are fixed on the ceramic substrate 51. The ceramic substrate 51 assists the metal components 70 to dissipate heat.

With the embodiments described above, the metal components 30 are embedded in the holder 10 by insert molding technology, the metal components 30 can dissipate heat generated by the laser 60 and the plurality of electric components 70 to ambient environment. The light-absorbing layer 36 is formed on the second heat dissipation part 33 and the extending part 34 to prevent reflection of light emitted by the laser. The metal components 30 are replacements for metal pins to realize miniaturization of the optical projection device 100 and reduce utilized space. The metal components 30 enhance structural strength of the optical projection device 100.

The embodiments shown and described above are only examples. Many details are often found in the art such as the other features of an optical projection device. Therefore, many such details are neither shown nor described. Even though numerous characteristics and advantages of the present technology have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. An optical projection device comprising:
   a holder; wherein the holder comprises a lens receiving groove, an electric component receiving groove connected to the lens receiving groove and a connecting receiving groove connected to the lens receiving groove, the electric component receiving groove, and ambient environment;
   two metal components opposite to each other, wherein each of the two metal components comprises a first heat dissipation part, a second heat dissipation part, and a connecting part connected to the first heat dissipation part and the second heat dissipation part; the first heat dissipation part is formed on an exterior surface of the holder, the connecting part is received in the connecting receiving groove, the second heat dissipation part is formed on an inner wall of the electric component receiving groove.

2. The optical projection device of claim 1, wherein each of the two metal components further comprises an extending part, the extending part perpendicularly extends out from junction of the second heat dissipation part and the connecting part to a direction perpendicular to the second heat dissipation part.

3. The optical projection device of claim 2, wherein the optical projection device further comprises a laser, the laser is received in the electric component receiving groove, a light-absorbing layer is formed on the second heat dissipation part and the extending part, the light-absorbing layer faces the laser.

4. The optical projection device of claim 3, wherein the optical projection device further comprises a lens, the lens is received in the lens receiving groove; a light-passage is formed on and runs through the extending part, the light-passage is arc-shaped, light generated by the laser passes through the light-passages and enters into the lens.

5. The optical projection device of claim 3, wherein the optical projection device further comprises a printed circuit board, the holder is fixed on the printed circuit board, the laser is formed on and electrically connected to the printed circuit board.

6. The optical projection device of claim 5, wherein two second connecting blocks extend out from the second heat dissipation part and away from the first heat dissipation part, the two second connecting blocks are perpendicular to the second heat dissipation part, the two second connecting blocks are electrically connected to the printed circuit board by a second conducting resin.

7. The optical projection device of claim 6, wherein the second connecting block and the extending part lie on different side of the second heat dissipation part.

8. The optical projection device of claim 1, wherein the holder further comprises a diffraction optical element (DOE) receiving groove, the DOE receiving groove is connected to the lens receiving groove; the optical projection device further comprises a DOE, the DOE is received in the DOE receiving groove.

9. The optical projection device of claim 8, wherein a step part is formed between the DOE receiving groove and the lens receiving groove, the DOE is formed on the step part.

10. The optical projection device of claim 8, wherein the holder further comprises two first connecting block receiving grooves, the two first connecting block receiving grooves are opposite to each other and connected to the DOE receiving groove; each of the first heat dissipation parts comprises a gap, the gap is opposite to the first connecting block receiving groove; two first connecting blocks are perpendicular to the first heat dissipation parts, one end of each of the first connecting blocks 312 is defined at each of the gaps, the first connecting block is received in the first connecting blocks receiving groove.

11. The optical projection device of claim 10, wherein the first connecting block and the second heat dissipation part lie on a same side of the connecting part.

12. The optical projection device of claim 10, wherein the DOE is electrically connected to the first connecting blocks by two first conducting resins.

\* \* \* \* \*